(12) United States Patent
Kim

(10) Patent No.: US 9,391,137 B2
(45) Date of Patent: Jul. 12, 2016

(54) POWER SEMICONDUCTOR DEVICE AND METHOD OF FABRICATING THE SAME

(71) Applicant: Magnachip Semiconductor, Ltd., Cheongju-si (KR)

(72) Inventor: In Su Kim, Cheongju-si (KR)

(73) Assignee: Magnachip Semiconductor, Ltd., Cheongju-si (KR)

( * ) Notice: Subject to any disclaimer, the term of this patent is extended or adjusted under 35 U.S.C. 154(b) by 0 days.

(21) Appl. No.: 14/734,326

(22) Filed: Jun. 9, 2015

(65) Prior Publication Data

US 2016/0155794 A1   Jun. 2, 2016

(30) Foreign Application Priority Data

Nov. 28, 2014 (KR) .................. 10-2014-0168717

(51) Int. Cl.
*H01L 29/66* (2006.01)
*H01L 29/06* (2006.01)
*H01L 29/739* (2006.01)
*H01L 29/10* (2006.01)
*H01L 29/08* (2006.01)

(52) U.S. Cl.
CPC ........ *H01L 29/0623* (2013.01); *H01L 29/0696* (2013.01); *H01L 29/0804* (2013.01); *H01L 29/0821* (2013.01); *H01L 29/1095* (2013.01); *H01L 29/66325* (2013.01); *H01L 29/7393* (2013.01)

(58) Field of Classification Search
CPC ............ H01L 29/0623; H01L 29/0696; H01L 29/0804; H01L 29/0821; H01L 29/1095; H01L 29/66325; H01L 29/7393
See application file for complete search history.

(56) References Cited

U.S. PATENT DOCUMENTS

| | | | |
|---|---|---|---|
| 5,329,142 | A | 7/1994 | Kitagawa |
| 5,525,816 | A | 6/1996 | Takahashi |
| 5,751,024 | A | 5/1998 | Takahashi |
| 6,040,599 | A | 3/2000 | Takahashi |
| 6,072,214 | A | 6/2000 | Herzer et al. |
| 6,392,272 | B1 | 5/2002 | Hasegawa |
| 6,683,343 | B2 | 1/2004 | Matsudai et al. |
| 6,737,705 | B2 | 5/2004 | Momota et al. |
| 6,768,168 | B1 | 7/2004 | Takahashi |
| 6,781,199 | B2 | 8/2004 | Takahashi |
| 6,781,200 | B2 | 8/2004 | Ishimura et al. |
| 6,809,349 | B2 | 10/2004 | Yamaguchi et al. |
| 6,953,968 | B2 | 10/2005 | Nakamura et al. |
| 7,675,113 | B2 | 3/2010 | Sakamoto et al. |
| 8,455,958 | B2 * | 6/2013 | Tsuzuki .............. H01L 29/0696 257/139 |
| 2010/0291767 | A1 * | 11/2010 | Miura .................. C23C 14/165 438/653 |

* cited by examiner

*Primary Examiner* — Nicholas Tobergte

(57) ABSTRACT

Provided are a power semiconductor device and method of fabricating the same, in particular a power semiconductor device such as an Insulated Gate Bipolar Transistor (IGBT) including a cell region with a trench structure formed to include a dummy trench and a first trench and a termination region with a termination ring formed surrounding the cell region. Such a power semiconductor device is designed to operable with high power conditions such as when an operating voltage is 600 V, 1200 V and so on.

24 Claims, 10 Drawing Sheets

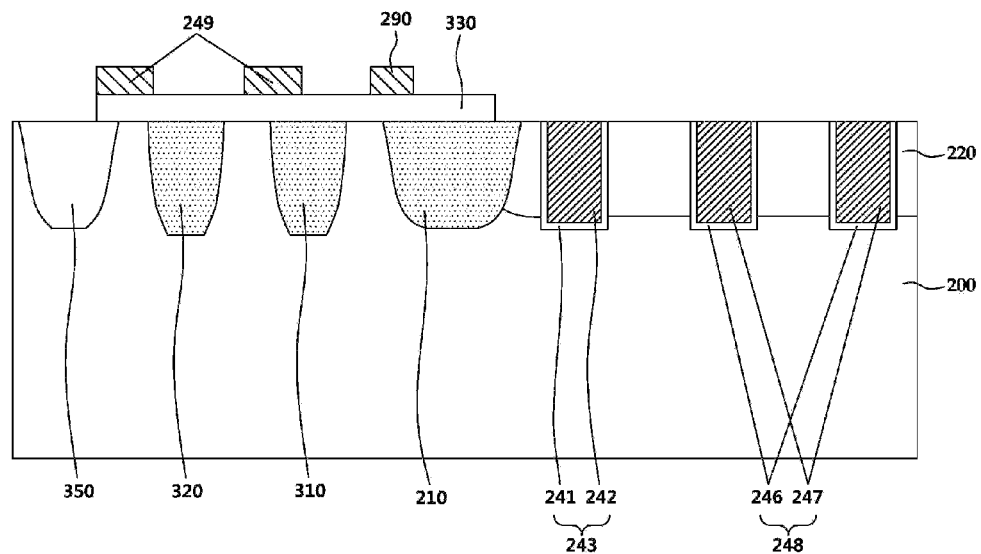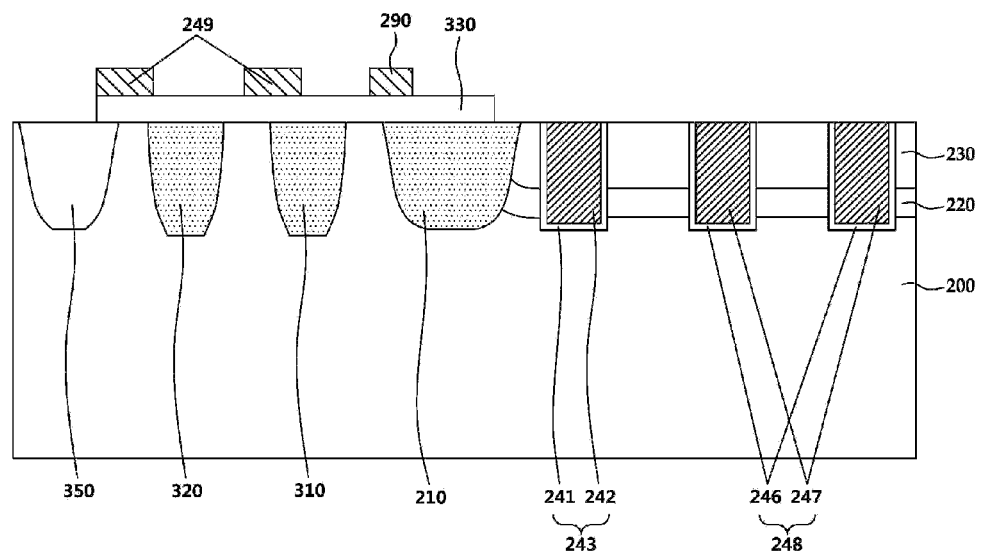

POWER SEMICONDUCTOR DEVICE AND METHOD OF FABRICATING THE SAME

CROSS-REFERENCE TO RELATED APPLICATION(S)

This application claims the benefit under 35 USC 119(a) of Korean Patent Application No. 10-2014-0168717 filed on Nov. 28, 2014 in the Korean Intellectual Property Office, the entire disclosure of which is incorporated herein by reference for all purposes.

BACKGROUND

1. Field

The following description relates to a power semiconductor device and method of fabricating the same. The following description further relates to a high power semiconductor device such as an Insulated Gate Bipolar Transistor (IGBT) including a cell region that includes a plurality of trench structures including a dummy trench and a active trench that is configured on a semiconductor substrate and a termination region that includes a termination ring that surrounds the cell region, and thereby is operable at a high power, such as power levels corresponding to voltage levels of 600 V and 1200 V.

2. Description of Related Art

Recently, research on energy saving and high energy efficiency products and development in alternative energy sources is proceeding actively due to limitations on available energy sources. This research has led to greater interest in Smart Grid technologies, Electrical Vehicle (EV) technologies, and photovoltaic power generation technologies. Thus, the importance of a power converter that is one of the most important components in such a system is increasing. The capacity of a power converter is increasing, and thus such a power converter is being designed to bear high electricity and high voltage operation with simultaneous low on-resistance and quick response. Having these qualities accompany high efficiency and high frequency operation opens possibilities for size minimization and weight lightening when producing such a power converter.

Currently the most suitable power semiconductor device for meeting such requirements is the Insulated Gate Bipolar Transistor (IGBT). The IGBT is a three-terminal power semiconductor device primarily used as an electronic switch, which has been developed to combine high efficiency and fast switching. In such an IGBT, a low concentration drift region is formed as a thin region, and thereby reduces loss of on-resistance, and also enables a materialization of a high frequency product through concentration adjustment of a P-type collector region and control of minority carrier movement time and also enables materialization of hundreds of amperes when a high breakdown voltage of over 1200 V in the context of such a module is applied.

FIG. 1 is a cross-sectional view of an Insulated Gate Bipolar Transistor.

As illustrated in the example of FIG. 1, the illustrated Insulated Gate Bipolar Transistor includes a substrate 100, a P+ region 110, an N+ region 120, a gate electrode 130, an emitter electrode 140, a field stop layer 150, and a P+ collector layer 160.

The high concentration field stop layer 150 is used in the low concentration N-type substrate 100 to continuously decrease an electrical field by being configured between P+ collectors 110 and make the electrical field zero before the field reaches a P+ collector layer 160. Thus, in such a technology, before reaching a field stop layer 150, the electrical field is intended to be made into zero at its off-state, by using a very thick substrate, such as a substrate of 200 μm thickness. Moreover, a resistance is to be made high by making doping concentration of the substrate 100 low. In this case, due to extreme changes of a doping concentration in a substrate, switching loss is relatively large due to a thick substrate. Thus, in order to overcome such issues, use of the field stop layer 150 came into use. By using the field stop layer 150, a thickness of the substrate 100 does not have to be as thick, so it can accordingly be thinner and avoid issues that would correspond to a thicker substrate.

However, it is required to handle a thin wafer with care since a thin wafer is more fragile as substrate thickness becomes thinner. Moreover, as substrate thickness becomes thinner, features of short-circuits may develop. Useable IGBT devices that still have a high immunity against short-circuits accompanying a thin IGBT device are advantageous.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a power semiconductor device includes a substrate, a trench structure situated in the substrate and comprising first trenches and dummy trenches formed adjacent to the first trenches, a first well region of a second conductivity type situated between the first trenches, a base region of a first conductivity type situated on the first well region, a source region of the second conductivity type and a first contact region of the first conductivity type situated in the base region, gate insulating layers situated in the first trenches and the dummy trenches, gate electrodes situated on the gate insulating layers, a field stop layer situated below the base region, a collector layer and a drain electrode situated below the field stop layer, and a dummy cell region situated between the first trenches and the dummy trenches, wherein the dummy cell region has no channel region.

The power semiconductor device may further include a cell region, a transition region and a termination region located in the substrate, a first termination ring of the first conductivity type having a first depth surrounding the cell region, situated in the transition region, and a second termination ring adjacent to the first termination ring, situated in the termination region, and wherein the first termination ring has a width larger than that of the second termination ring.

The power semiconductor device may further include a second well region of the second conductivity type having a doping concentration higher than that of the semiconductor substrate and that is situated adjacent to the second termination ring.

The first trenches and the dummy trenches may have a trench depth deeper than that of the first well region.

The power semiconductor device may further include an emitter electrode connected to the first termination ring, the source region and the first contact region, a gate terminal electrically connected to the gate electrode, and a field plate situated over the substrate and connected to the second termination ring.

A second contact region of the first conductivity type may be situated in the first termination ring and may be electrically connected to the emitter electrode.

The substrate may include a first surface and a second surface opposite to the first surface.

In another general aspect, there is provided a manufacturing method of forming the power semiconductor device, including forming the substrate to comprise a first epi layer of low doping concentration and a second epi layer of high doping concentration.

The substrate may include a first surface and a second surface opposite to the first surface, and forming the field stop layer on the back of the substrate may be performed by conducting a back grinding process on a second surface of the semiconductor substrate and by exposing the second epi layer.

Forming the gate electrode in the trench structure may include depositing a polysilicon layer with a top surface in the trench structure, oxidizing a top surface of the polysilicon layer to form an oxidized surface layer of the polysilicon layer, removing the oxidized surface layer using wet-etching, and performing an etch-back process to form the gate electrode.

In another general aspect, a power semiconductor device includes a substrate, including a cell region, a transition region and a termination region located in the substrate; first trenches and dummy trenches located adjacent to the first trenches, situated in the substrate, wherein the first trenches and dummy trenches each include a gate insulating layer that includes a gate electrode, a well region of a second conductivity type situated between the first trenches including a base region of a first conductivity type situated on the first well region, wherein the base region includes a source region of the second conductivity type and a first contact region of the first conductivity type, situated in the base region, a field stop layer situated below the base region, a collector layer and a drain electrode situated below the field stop layer, and a dummy cell region situated between the first trenches and the dummy trenches, wherein the dummy cell region has no channel region.

The power semiconductor device may further include a first termination ring of the first conductivity type having a first depth surrounding the cell region, formed in the transition region, and a second termination ring adjacent to the first termination ring, formed in the termination region, and the first termination ring may have a width larger than that of the second termination ring.

The substrate may include a first surface and a second surface opposite to the first surface.

The power semiconductor device may further include a second well region of the second conductivity type having a doping concentration higher than that of the semiconductor substrate and that is situated adjacent to the second termination ring.

The first trenches and the dummy trenches may have a trench depth deeper than that of the first well region.

The power semiconductor device may further include an emitter electrode connected to the first termination ring, the source region and the first contact region; a gate terminal electrically connected to the gate electrode, and a field plate situated over the substrate and connected to the second termination ring.

A second contact region of the first conductivity type may be situated in the first termination ring and may be electrically connected to the emitter electrode.

In another general aspect, a method of forming a power semiconductor device includes preparing a semiconductor substrate, wherein the substrate comprises a first epi layer of low doping concentration and a second epi layer of high doping concentration, wherein the substrate is divided into a termination region, a transition region, and a cell region, forming a first termination ring on the transition region or the termination region of the substrate, forming a first well region in the cell region that overlaps with the first termination ring, forming trench structures to have a certain depth in the substrate, comprising first trenches and dummy trenches, forming gate insulating layers and gate electrodes in the trench structures, forming a base region of a first conductivity type situated on the first well region, forming a source region of the second conductivity type and a first contact region of the first conductivity type situated in the base region, forming a field stop layer situated below the base region, forming a collector layer and a drain electrode situated blow the field stop layer, and forming a dummy cell region situated between the first trenches and the dummy trenches, wherein the dummy cell region has no channel region.

The first termination ring may be formed by ion injecting an impurity, performing a first mask process, and performing a first annealing.

The first well region may be formed using a second mask process and a second annealing.

Forming the trench structures may include using a hard mask layer comprising 3 layers of insulating film.

The first trenches and the dummy trenches may have a trench depth deeper than that of the first well region.

The method may further include forming a second termination ring, wherein the first termination ring has a greater width than the second termination ring.

The method may further include depositing a polysilicon layer with a top surface in the trench structure, oxidizing a top surface of the polysilicon layer to form an oxidized surface layer of the polysilicon layer, removing the oxidized surface layer using wet-etching, and performing an etch-back process to form the gate electrodes.

Other features and aspects will be apparent from the following detailed description, the drawings, and the claims.

BRIEF DESCRIPTION OF THE DRAWINGS

FIG. 6A to FIG. 6G are diagrams illustrating a power semiconductor device and method of fabricating the same according to another example.

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
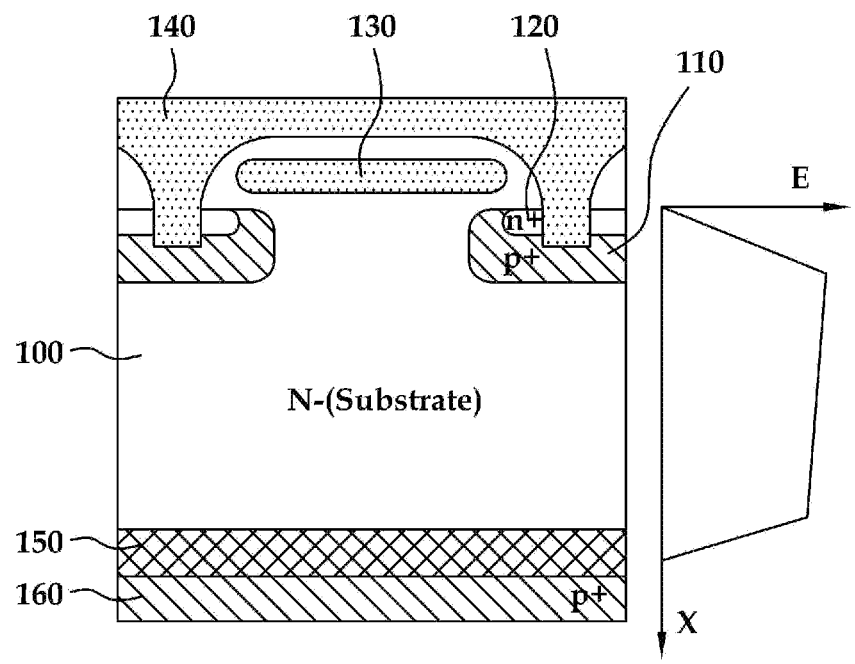
FIG. 1 is a cross-sectional view that illustrates a field stop (FS) Insulated Gate Bipolar Transistor (IGBT) structure.

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

Certain examples are now described in greater detail with reference to the accompanying drawings.

In the following description, the same drawing reference numerals are used for the same elements even in different drawings. The matters defined in the description, such as detailed construction and elements, are provided to assist in a comprehensive understanding of the present examples. Accordingly, it is apparent that the examples are potentially carried out without those specifically defined matters. Also, well-known functions or constructions are not described in detail since they would obscure the invention with unnecessary detail.

While the expressions such as "first" or "second" are potentially used to refer to various elements, the elements are not intended to be limited by the expressions. The expressions are used only for the purpose of distinguishing one element from the other in the description.

The expressions are used herein only for the purpose of explaining specific examples and are not intended to limit the present examples. An expression in singular form encompasses plural meaning, unless otherwise specified. Throughout the description, the expression "comprise" or "have" is used only to designate the existence of characteristic, number, step, operation, element, component or a combination thereof which are described herein, but is not used to preclude a possibility of existence of one or more of the other characteristics, numbers, steps, operations, elements, components or combinations of these as an addition to the original item.

Moreover, words such as "first conductivity type" and "second conductivity type" refer to opposite conductivity types such as a P-type conductivity or an N-type conductivity and respective examples that are discussed herein include complementary examples. Hereinafter, in the first example, a first conductivity type is a P-type and a second conductivity type is an N-type.

Figure 2:
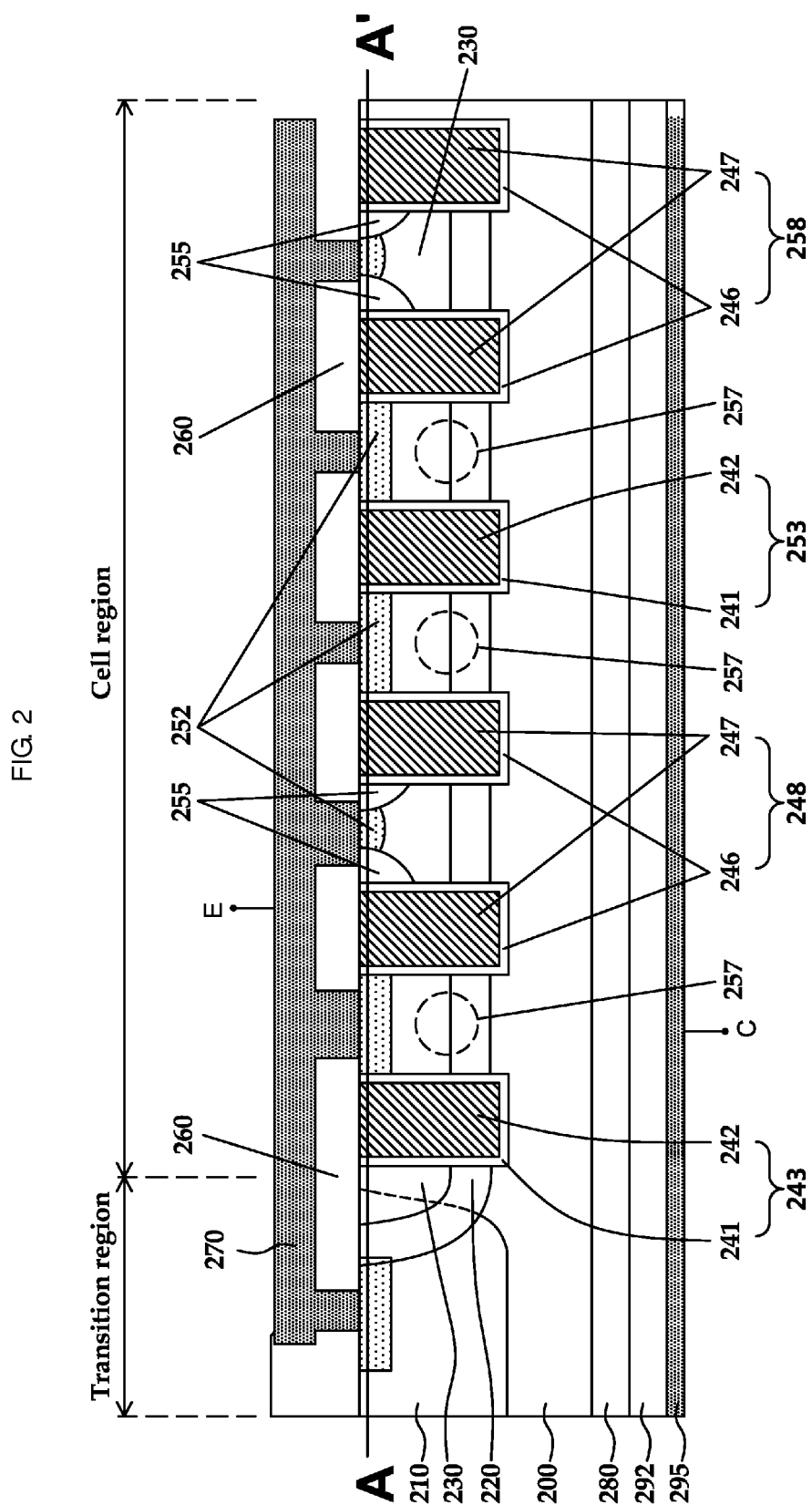
FIG. 2 is a cross-sectional view that illustrates a power semiconductor device according to a first example.
Figure 3:
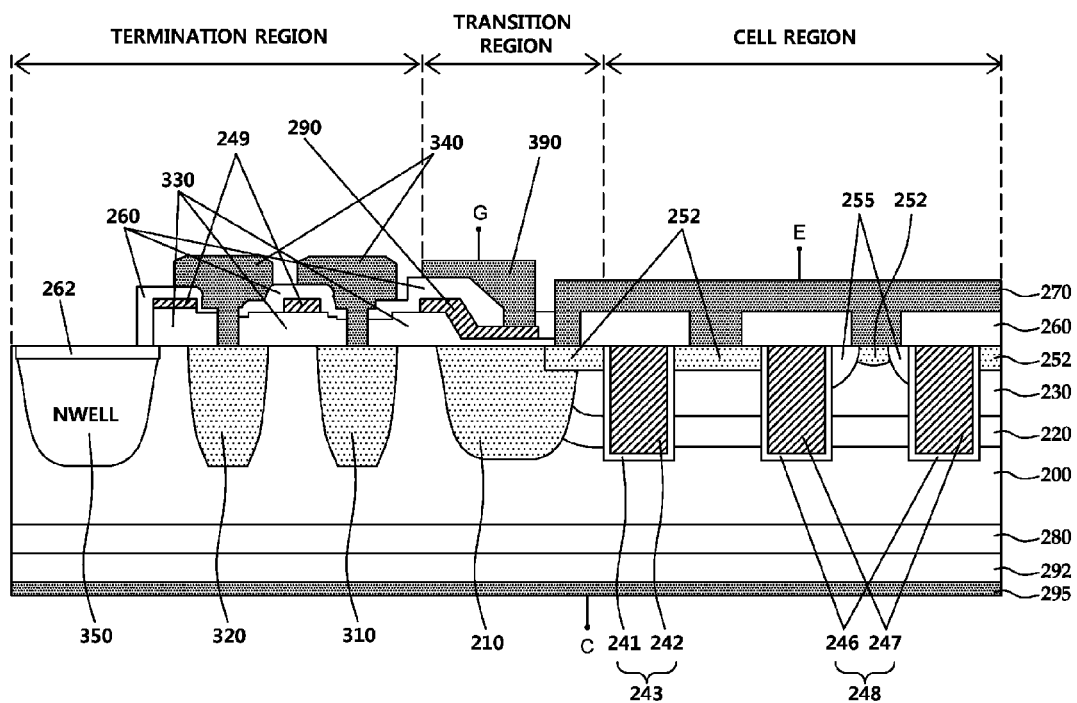
FIG. 3 is a cross sectional view that illustrates an overall structure including a power semiconductor device of FIG. 2.
Figure 4:
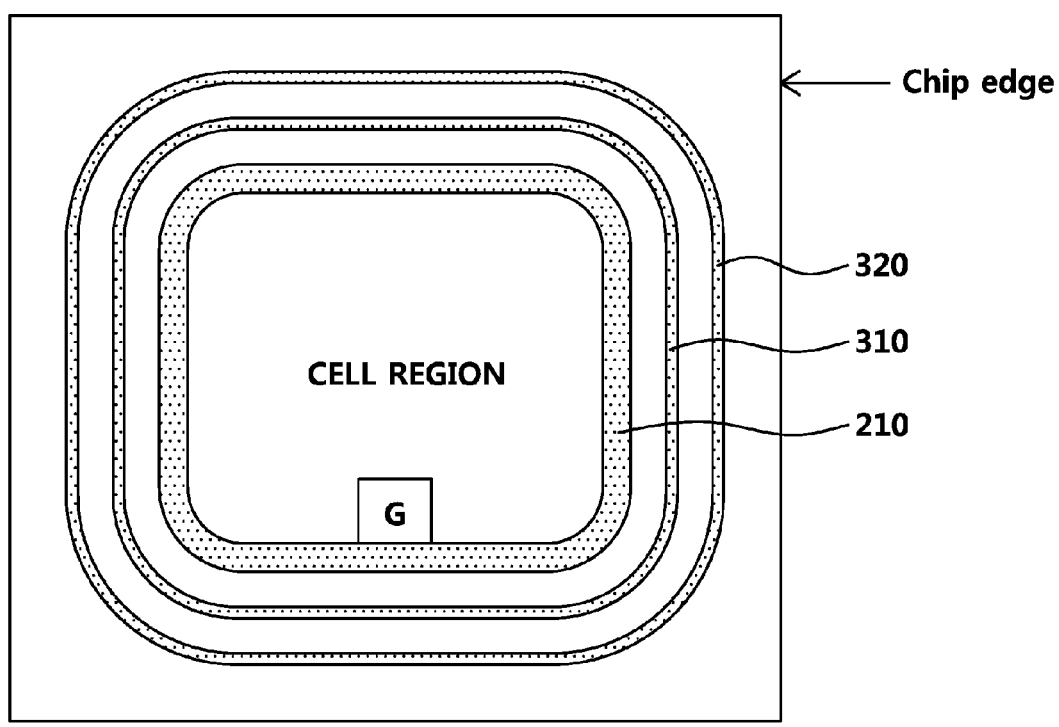
FIG. 4 is a top view that illustrates an overall structure of FIG. 4.
Figure 5:
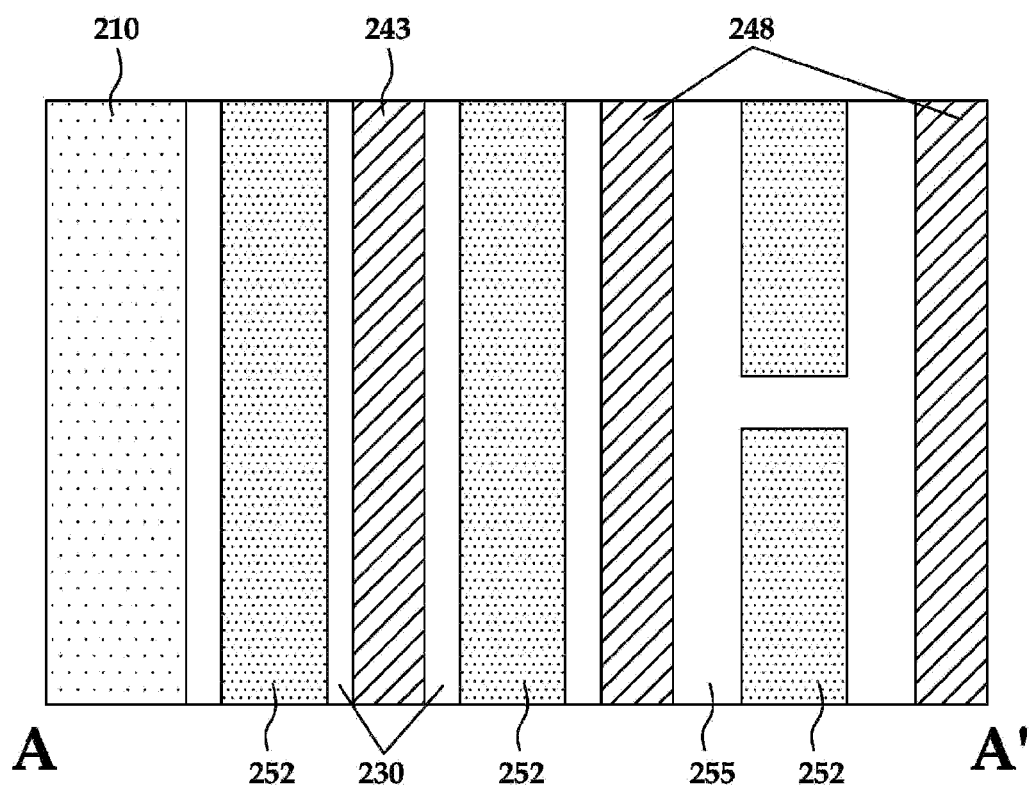
FIG. 5 is a top view of a cutting plane (A-A') of FIG. 2.

FIG. 2 is a cross-sectional view illustrating a structure of a power semiconductor device according to the first example. FIG. 3 is a cross-sectional view of an overall structure including a power semiconductor device of the example of FIG. 2. FIG. 4 is a top view illustrating an overall view of FIG. 3. FIG. 5 is a top view illustrated according to a cutting plane (A-A') of FIG. 2.

Referring to the example of FIG. 2, a power semiconductor device according to the present examples is configured to be based on various semiconductor substrates 200. An epitaxial (EPI) wafer doped with an N-type or P-type impurity is applied on the substrate 200. Epitaxy refers to the deposition of a crystalline overlayer on a crystalline substrate. For example, an epitaxial wafer can include a Czochralski (Cz) wafer produced by a Czochralski method which is preferable for producing large diameter wafers. The Czochralski process is a method of crystal growth used to obtain single crystals of semiconductors. For example, production of Czochralski silicon includes melting high-purity semiconductor grade silicon with very low levels of impurities in a crucible at an extremely high temperature, and potentially doping the silicon. A rod-mounted seed crystal is dipped into the molten silicon, and the rod is slowly pulled upwards while being rotated. A large, single-crystal that is a cylindrical ingot is extracted by careful control of temperature, rate of extraction, and rate of rotation. Careful monitoring allows avoidance of instabilities, and the process may occur in a quartz chamber with an argon atmosphere that is inert.

In an example, the epitaxial wafer uses a wafer that includes a test wafer with an epi-layer grown, as discussed above, according to a Czochralski process. In such an example, the epitaxial wafer uses a wafer weakly doped to have an N-type epi-layer. For example, an epi-layer having a resistivity of under approximately 100 ohm-cm is applied, where the epi-layer has a thickness of under approximately 120 μm is applied. The thickness of the substrate 200 is a thickness value of an initial substrate 200 that is applied on a power semiconductor device while fabricating the same according to the present examples and a final thickness value of a power semiconductor substrate has a smaller thickness value than this initial thickness values, based on a back grinding process of FIG. 6F. Moreover, the substrate 200 is an EPI-wafer including two epi-layers of different concentration. Therefore, an epi-layer with high concentration becomes a field stop layer 280 and an epi-layer 200 with low concentration becomes an N-type drift region. In the present examples, included in the first example is applying an epi-wafer onto an epi-layer of differing concentration, but the examples of the present invention are not limited to this example. Hereinafter, a manufacturing process that uses an EPI-wafer with an epi layer of a different concentration from the above is explained in further detail with respect to FIG. 6A to FIG. 6G.

FIG. 2 illustrates a technical feature in which an example includes a cell region of semiconductor substrate 200 as above but a power semiconductor device of the present invention also potentially includes a termination region configured so as to surround the cell region, as shown in FIG. 3 and FIG. 4.

For example, a termination region is potentially required to maintain a cell region with a high operating voltage in a semiconductor chip. Particularly, a cell region includes a high voltage (HV) region that has a high voltage. Thus, a remaining region of the semiconductor chip comprises a low voltage (LV) region that is driven at a low operating voltage. A termination region is required between such an HV region and an LV region. The HV region is to be electrically isolated from the LV region through use of a termination region. Therefore, an electric field that is induced in the HV region is preferably lowered or distributed in steps. For example, when a P-type ring is formed on a termination region, an electric field continuously becomes lower and an electric field value becomes closer to zero as it goes further from the HV cell region.

Moreover, a transition region is arranged between a cell region and a termination region. The transition region is at an edge of a cell region thus, is also referred to as an edge cell region. However, maintaining a certain level of electric field is necessary in such a transition region. Accordingly, a first termination ring 210 of P-type is configured to be located in a transition region so that it surrounds a cell region. Additionally, the first termination ring 210 is electrically connected with an emitter electrode 270. Thus, the first termination ring 210 has the same electronic potential as a cell region. Thereby, a same electric potential can be maintained in these areas. A first termination ring 210 is configured to have the capability to be able to restrain 600 V or 1200 V of breakdown voltage. Specifically, the first termination ring 210 is configured on the substrate 200 at a certain depth and configured to surround a cell region, as illustrated in FIG. 4. In FIG. 4, a shape of the first termination ring 210 corner is illustrated as a round rectangular shape, such that the first termination ring 210 is largely rectangular, but has rounded corners. However, the feature of a first termination ring 210 according to the present examples is not limited to examples where the first termination ring 210 and the first termination ring 210 also takes on appropriate other shapes in other examples.

Further, as illustrated in the examples of FIGS. 3 and 4, an outer region of the first termination ring 210, in other words a termination region optionally is additionally configured to include both a P-type second termination ring 310 and a P-type third termination ring 320. The second and third termination ring 310 and 320 are potentially necessary to gradually reduce a high electric field of a cell region, to achieve the requirements discussed above. Therefore, by including the termination rings, the electric field is induced to become zero at an edge of a termination region. FIGS. 3 and 4 illustrate the first example in that two additional termination rings, that is second and third termination rings are configured on an outer region of a first termination ring 210. However, according to other examples, more than three termination rings are added on an outer region of the first termination ring 210. As a number of termination rings increases, chip size enlarges, because space is required for each additional termination ring. To manage this issue, a second, third and fourth termination ring are designed with progressively reduced width as the chip is laid out to include the second to the fourth termination rings. Likewise, the first termination ring 210 is potentially designed differently according to a breakdown voltage specification of an IGBT device that is being manufactured. More termination rings are required as breakdown voltage increases. Thereby, chip area is enlarged due to the presence of these additional termination rings, and are a consideration in successful chip design.

Referring to FIG. 2, an N-type well region 220 is formed to overlap with part of the first termination ring 210 in a cell region of a semiconductor substrate. The N-type well region 220 is designed to store the hole carriers flowing from the P+ collector region 292.

Thus, the well region 220 is configured to overlap with a part of the P-type first termination ring 210. Specifically, the well region 220 is configured to overlap with a part of a first termination ring 210 on a region that is part of a termination region of a semiconductor substrate 200 that is in contact with a cell region.

As mentioned above, the well region 220 blocks hole carrier movement from a P+ collector region to an emitter side. Because a junction voltage between the N-type well region 220 and a P-base region 252 is larger than the junction voltage between N-drift region 200 and the P-base region 252. A number of hole carriers and electron carriers stay in the drift region 200. This charge accumulation function causes the ON voltage for the IGBT to be substantially lower than for the IGBT without such a well region 220. Accordingly, a switching loss is reduced because a switching speed becomes faster. However, to achieve such an effect, an impurity concentration of the well region 220 is to be controlled to make a $V_{ce}$, which is an ON stage voltage drop between a cathode and an emitter, value becoming a minimum in an IGBT element.

A P-type base region 230 formed on the well region 220 partially overlaps with the first termination ring 210. Thus, the P-type base region 230 is formed with a shallower depth and a smaller width than the well region 220, and hence is included in the well region 220. The depth of the P-type base region 230 is a value that has a huge effect on a BV (Breakdown Voltage) efficiency of an IGBT device according to the present examples, and hence a depth of a P-type base region 230 is applied differently depending on a feature of an IGBT device. The P-type base region 230 is configured to have an identical depth with a first termination ring 210. However, in such an example an N-type well region 220 is configured to have a deeper depth than a first termination ring 210. Preferably, the P-type base region 230 is configured to be at a lower depth than a first termination ring 210 to provide a feature of a desired BV (breakdown voltage) of an IGBT device.

In other words, the examples of FIG. 2 and FIG. 3 illustrate a first termination ring 210 that is configured to have a larger depth than the N-type well region 220 and the P-type base region 230 according to a first example. However, a depth of the first termination ring 210 and the N-type well region 220 are potentially chosen differently in other examples.

Further, in a cell region in which an N-type well region 220 and a P-type base region 230 are located, a plurality of trench structures 243, 248, 253, 258 are also located. For example, a plurality of trench structure potentially include a first dummy trench 243, a second dummy trench 253, at least one pair of first trenches 248 and at least one pair of second trenches 258. For example, such a plurality of trench structures include a first dummy trench 243 located adjacent to left side of a pair of a first trench and a second dummy trench 253 formed between the at least one pair of first trenches 248 and the at least one pair of second trenches 258. For example, the plurality of trench structures include trenches in an order of a first dummy trench—a first trench—a first trench and then a second dummy trench—a second trench—a second trench in a cell region. In such an example, a P-type doping region 252 is formed not only on a substrate 200 between a pair of first trenches 248 or a pair of second trenches 258 but also between all trench regions.

Moreover, an N-type source region 255 is formed to be in contact with a pair of first trenches 248 or a side of a second trench 258 and to overlap with a part of a high concentration P-type region 252 in a P-type base region 230. Here, a first trench and a second trench that are formed on an active cell region are referred to as an active trench. Thus, an N-type channel region is formed in a region between a first trench and a second trench to be surrounded by a source region and a base region. However, the N-type channel region is not formed in a dummy trench vicinity region because there is no source region in this vicinity.

In particular, the N-type source region 255 is not formed in the region between a first dummy trench 243 and a first trench 248. Likewise, the N-type source region 255 is not formed in region between a second dummy trench 243 and a second trench 258. However, a high concentration P-type doping region 252 is formed between all trench regions. Thus, a high concentration P-type doping region 252 is located to be in contacted to be in contact with a dummy trench and a first trench 248 or a second trench 258, but source region 255 is characterized by not being formed in contact with the dummy trenches. Therefore, the dummy cell region 257 adjacent to the dummy trench structure 253 has no channel region. Instead, the dummy cell region 257 is electrically connected to the emitter electrode 270. Thus, the dummy cell region 257 has a P-base region 230 and a P+ contact region 252 which are together electrically connected with the emitter electrode 270. When the device is in a turned-off state, the hole carrier is intended to have a connection to drain electrode 295 or emitter electrode 270 that allows fast outward flow. For example, in response to the dummy trench structure 243 being provided, the hole carrier permits direct flow outward through emitter electrode 270 that is adjacent to the dummy trench structure 243. Such a configuration reduces switching loss time. Hence, if the dummy cell region 257 is completely covered with an inter-dielectric layer 260, the hole carrier does not pass through the dummy cell region 257. Hence, the inter-dielectric layer 260 blocks the current path in such an area.

As mentioned above, there is no channel region in the dummy cell region 257, which improves a short circuit characteristic of the IGBT device. Thus, the $V_{ce}$ in the present IGBT device slightly increases because some areas in the cell region have no channel regions in the IGBT device. Under the short-circuit condition, a very large output current and a very large output voltage are applied to the IGBT device. In various examples, a certain time is provided that will pass before destroying such an IGBT device under the short-circuit condition. For example, a short circuit current of approximately 1100 A/cm$^2$ is only possibly withstood for a time period of some microseconds at a short circuit voltage of 600 V. Hence, a robust IGBT device that has a high-level of short-circuit resistance, that is, a capability to withstand short-circuit conditions is required to successfully over overcome concerns with respect to the short-circuit condition. As the $V_{ce}$ increases, the output current for the IGBT device is potentially suppressed. Such a capability causes an increase time for withstanding the short-circuit condition.

A plurality of trench structures as above are potentially formed to have a larger depth than the N-type well region 220 and the P-type base region 230. In other words, in such an example, the plurality of trench structure are formed to penetrate the P-type base region 230 and also the N-type well region 220 from a surface of a semiconductor substrate 200, as illustrated with reference to the examples of FIG. 2 and FIG. 3. Gate insulating layers 241, 246 and gate electrodes 242, 247 are formed in a plurality of inner trench structures. For example, such structures are formed particularly in an inner region of a dummy trench and a first trench. In particular, gate electrodes 241, 246 are formed inside the trench structures 243, 248 and a doped polysilicon is used, as discussed above to form gate electrodes 242, 247 over the gate insulating layers 241, 246. Further, a inter-dielectric layer 260 is formed over the gate electrodes 241, 246 to isolate the gate electrodes 242, 247 from an emitter electrode 270.

Further, a field stop layer 280, a collector layer 292 and a drain electrode 295 are formed on a second surface of semiconductor substrate opposite to the first surface. For example, the features are formed in an order of a field stop layer 280, a collector layer 292 and a drain electrode 295, in a direction from top to bottom. In the examples, a back grinding process is applied to the lower side or back of a semiconductor substrate before forming the field stop layer 280, the collector layer 292 and the drain electrode 295 on a lower side of the semiconductor substrate. Such an approach is recited further through considering a power semiconductor device and a method of fabricating the same according to the present examples. For example, a drain electrode 295 is formed by deposing back metal on a lower side of a semiconductor substrate 200 with the field stop layer 280 and a collector layer 292 formed on the drain electrode 295.

Additionally, although not illustrated in FIG. 2, a termination region of a power semiconductor device is potentially formed as is illustrated in FIG. 3. In particular, an insulating layer 330 is formed on an upper side of a semiconductor substrate 200 of a termination region and a floating gate electrode 249 is formed on the upper portion of the insulating layer 330. The floating gate electrode 249 is formed through an identical process that is used for producing gate electrodes 242, 247 of trenches 243, 248 of the cell region interior. Moreover, inter-metal dielectric layer 260 is formed on the upper gate electrode 249. A field plate 340 including a metal electrode is formed on the inter metal dielectric layer 260. Thus, the field plate 340 relaxes electric field generated in a cell region. Here, relaxation refers to the momentary delay or lag in the dielectric constant of a material. Moreover, the field plate 340 is connected with P-type second and third termination rings 310, 320. The field plate and the floating gate electrode perform the same operation and thereby are potentially used together by connecting each other. Furthermore, gate bus of polysilicon 290 is formed in parallel with a floating gate electrode 249. The gate bus of polysilicon 290 is electrically connected with gate electrodes 242, 247 formed inside a trench. Moreover, the gate bus of polysilicon 290 is electrically connected with a gate terminal 390 that is located on the top thereof. The gate bus of polysilicon 290 is also electrically connected with gate electrodes 242, 247. Thus, constant voltage can be applied on gate electrodes 242, 247 through a gate terminal 390.

Further, an N-type well region 350 and an N+ region 262 are additionally formed near P-type second and third termination rings 310, 320. For example, the N-type well region 350 and the N+ region 262 are formed near an end terminal of a termination region and perform as channel stoppers.

In particular, a sawing process is implemented as a way to form a semiconductor chip. However, a surface of a semiconductor chip potentially becomes rough due to the sawing process. Having such a rough surface easily becomes a cause of leakage current during semiconductor chip operation. Such a leakage current potentially causes problems with features of a semiconductor device. Thus, a region preventing such a leakage current from occurring on an end terminal of a termination region is included in examples. Accordingly, forming a channel stop layer including the N-type well region 350 and N+ region 262 on a side of a semiconductor chip that was previously roughened by a sawing process stops leakage current which is otherwise a problem featured in such a semiconductor device.

In particular, a depletion region of a P-type termination ring is extended to become very long in a high temperature. Herein, such extension of the depletion region is prevented by forming an N-type well 350 with a higher concentration than the semiconductor substrate 200. Thereby, the examples are designed to form an N-type well region 350 and an N+ region 262 with an identical conductivity type with a semiconductor substrate, but with a higher concentration.

Regarding a semiconductor device formed as above, a top-view diagram is included as FIG. 5 with reference to cross section (A-A') of the example of FIG. 2. In other words, a P-type doping region of high concentration 252 is formed on a P-type base region 230 and an N-type source region 255 and a P-type doping region 252 of high concentration is formed on region between two of a first trenches 248. In particular, viewed from the top, an N-type source region 255 is formed in an "H" shape and a P-type doping region 252 of high concentration is formed on a region between the portions of the N-type source region 255.

FIG. 6A to FIG. 6G are diagrams illustrating a power semiconductor device and method of fabricating the same according to another example of the present invention. Hereinafter, a power semiconductor device and a method of fabricating the same according to the present examples is recited in detail through FIG. 6A to FIG. 6G.

Figure 6A:
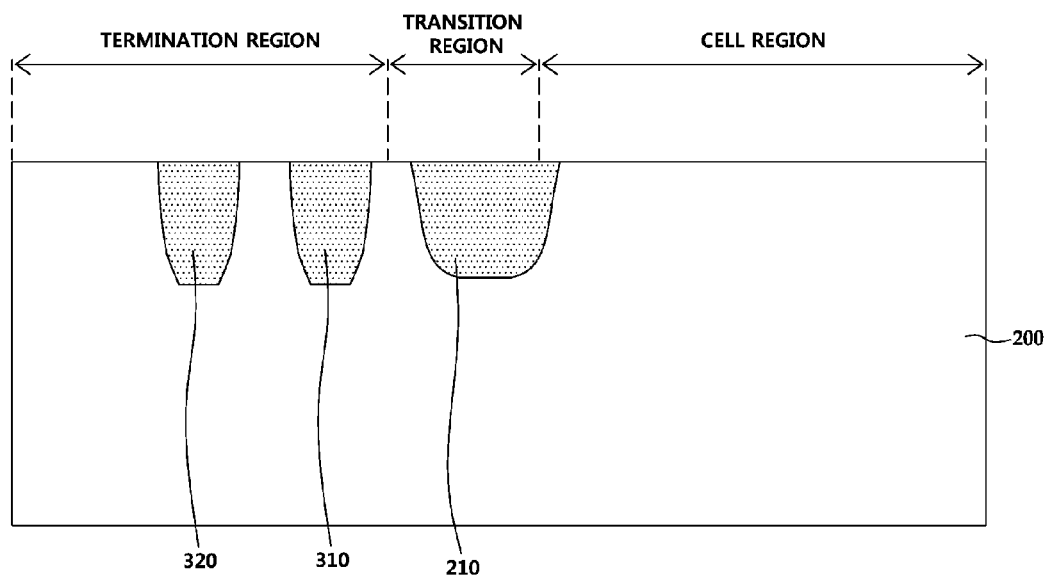

As illustrated in the example of FIG. 6A, preparing a power semiconductor device according to these examples first includes preparing a semiconductor substrate 200 with a thickness under 120 μm. In this example, the substrate 200 is applied with an N-type or P-type impurity, with an EPI wafer. Thus, an EPI wafer that is doped with an N-type or P-type impurity can be applied on the substrate 200. For example, the EPI wafer includes a czochralski (Cz) wafer that produced by a czochralski method that is a relevant method when producing large diameter wafers. For example, an EPI wafer includes a wafer that is test wafer including an epi-layer that is grown as above. For example, the EPI wafer potentially includes a wafer that is weakly doped in N-type epi-layer for use as the EPI wafer. An epi-layer with a resistivity approximately under 100 ohm-cm can be applied and an epi-layer with thickness of approximately under 120 μm is applied. The thickness of the substrate 200 is a thickness value of an initial substrate 200 that is applied on a power semiconductor device for fabricating the same according to the present examples and a final thickness value of a power semiconductor substrate has a smaller thickness value than this initial thickness as a result of a back grinding process as illustrated in FIG. 6F. Moreover, in another example, the substrate 200 is an EPI-wafer with two epi-layers of different concentration. In such an example, an epi-layer with a high concentration of dopant becomes a field stop layer 280 and an epi-layer 200 with a low concentration of dopant becomes an N-type drift region. In the present examples, one example recites applying an epi-wafer with epi-layers of different concentration but they are not limited to such an example.

Such a substrate 200 is divided into a termination region, transition region and cell region according to a regions that are relevant when generating a semiconductor device. Here, a cell region refers to a region at which a semiconductor device practically operates is formed. A termination region refers to a region at which there is a need for handling power as a semiconductor device formed on the cell region operates and to differentiate the cell regions from other cell region by such management. Moreover, a transition region is a region located between such a cell region and such a termination region.

Further, one or a plurality of termination rings 210, 310, 320 are formed such as on one of a transition region or a termination region of a semiconductor substrate 200. For example, a first termination ring 210 is formed on a transition region. For this formation, a first mask process, a P-type impurity injection, and a first annealing heat treatment process for appropriate distribution of such an injected impurity is applied. Through various processes as described above, one or a plurality of termination rings 210, 310, 320 are formed to have a certain depth on of a transition region or a termination region of a semiconductor substrate by ion injecting a P-type impurity, such boron (B) or boron monofluoride (BF). For this, a first annealing is used in a high temperature for appropriate dopant and impurity extension after impurity ion injection. For easy discussion, a termination ring 210 formed nearest to a cell region is referred to as a first termination ring. When considered herein, a first termination ring of the embodiment according to the present invention is formed to have a larger width than a second termination ring 310 and a third termination ring 320. In examples, an operating voltage of an IGBT device is controlled more stably through the aforementioned technical structure. For example, the larger a width of a termination ring is, the higher the internal voltage that is endurable. Three termination rings 210, 310 and 320 are illustrated in FIG. 6A, which is merely an example of one way to apply termination rings in an example. A number of the termination rings is potentially applied differently according to the chosen features that are aims when designing devices of an IGBT. For example, the depth of the termination ring is differently chosen according to goals for the device.

Figure 6B:
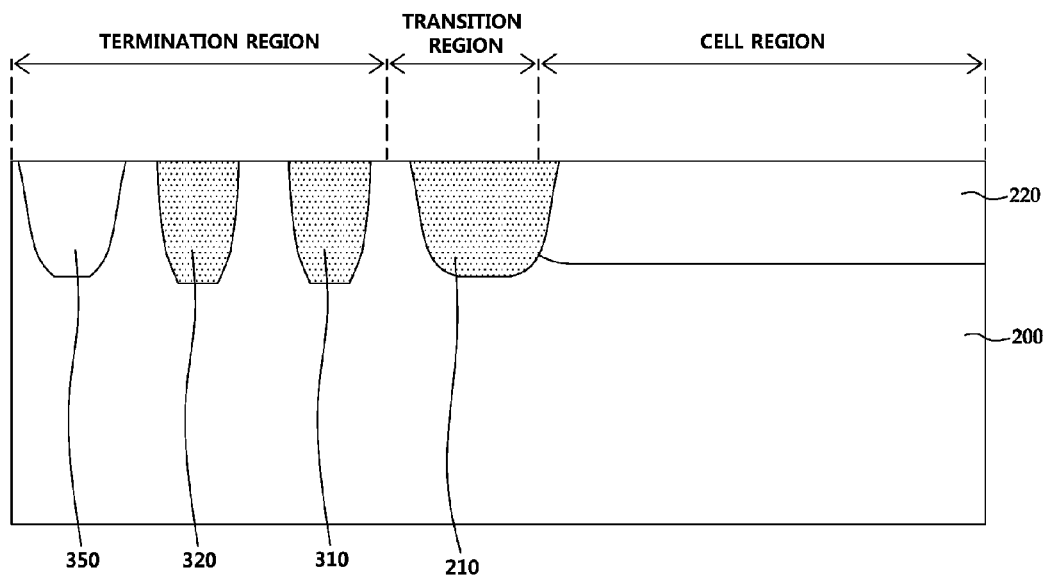

Further, as illustrated in the example of FIG. 6B, an N-type well region 220 is formed in a cell region of a semiconductor substrate, so as to overlap with a part of a first termination ring 210. For this, a second mask process and a second annealing heat treatment process for N-type impurity, such as phosphorus (P), and so on, and appropriate distribution of the injected impurity is applied. Here, the N-type well region 220 is formed in various depths and is formed to have a shallower depth than a first termination ring 210 as illustrated in FIG. 6B. According to the example, the N-type well region 220 is formed to have a greater depth than the first termination ring 210. However, it is preferable for the N-type well region 220 to be formed to have a shallower depth than a first termination ring 210 for IGBT device feature design. Thus, in another example, a second annealing process is implemented that uses a lower temperature than a first annealing process. Also, a consumption time of a second annealing process is determined to be shorter than a first annealing process. Thus, in this example, a P-type concentration of a first termination ring 210 is higher than an N-type concentration of a well region 200. Thus a first termination ring 210 is considered to be a P-type region. In other words, P-type dopants have a higher doping concentration than a net doping concentration of a first termination ring 210. Thus, a net P-type concentration of P-type first termination ring 210 region that overlaps with an N-type well region is lowered compared to remaining regions due to inter-compensation generated by N-type well region 220.

Further as illustrated in the example of FIG. 6C, an insulating layer 330 is formed on a part of the upper semiconductor substrate 200 and is used to provide the technical feature of examples that such example are able to isolate gate electrodes 249 and 290 from termination rings 210, 310, 320. Such an insulating layer 330 is generated through various processes, such as for example a Local Oxidation of Silicon (LOCOS) formation of the layer.

A plurality of trench structures are formed to have a certain depth in a cell region of a semiconductor substrate 200 and gate insulating layers 241, 246 and gate electrodes 242, 247, 249 are formed in the interior trench. For this purpose, a hard mask layer comprising 3 layers of insulating film is deposited so as to form a trench in the substrate 200, and the process includes performing a patterning process during the third mask process. Additionally, a substrate that uses a mask is etched using a mask pattern so as to configure trenches 243, 248. Herein, a 3 layer insulating film refers to a film comprising a first oxide layer, a nitride layer, and a second oxide layer. For example, such a three layer insulating layer is used to form a trench with a depth of 5-10 μm.

A plurality of trench structure are potentially formed in various depths. For example, a plurality of trench structure are formed to have an identical depth with a first termination ring 210 and or alternative are formed to have a larger depth than a first termination ring 210. The depth choice is selected differently according to an design aims of an IGBT device. In FIG. 6C, for convenient explanation hereinafter, a plurality of trench structures is illustrated as a dummy trench 243 and a first trench 248 for differentiation. After formation of a trench, the hard mask layer is removed, a sacrificed oxide film is formed and sacrificed oxide film is removed again. The performance of this process acts to cure any damage to sidewall surfaces of the trench.

Further, a gate insulating film 241 is formed on a side of a trench and an upper substrate. Moreover, polysilicon is deposited for formation of gate electrodes 242, 247. Floating gate type polysilicon 249 and gate bus type polysilicon 290 are formed in a same step. For example, the polysilicon surface is oxidized after polysilicon deposition. Then, the oxidized polysilicon is removed through wet etching. One reason why such a process is used is that because when the polysilicon surface is oxidized, the polysilicon surface becomes a little more flat. Hence, such flatness is favorable for the next process in the polysilicon etching process. Generally, in process of deposing polysilicon inside a trench, a seam is generated. When the seam is exposed to the outside due to the etching process, its electrical characteristics as a semiconductor device are degraded. Therefore, by oxidizing a polysilicon surface, the net height of a polysilicon layer potentially increases. Hence, distances from a seam increases, and thus the possibility of exposure of a seam when etching polysilicon decreases. Moreover, after a fourth mask process occurs, the process forms patterns on the polysilicon and forms a plurality of gate electrodes 242, 247 on a cell region, forms a gate bus 290 on a transition region, and forms a floating gate electrode 249 on a terminal region. Although they are not illustrated in the drawing, a plurality of gate electrode 242, 247 located on a cell region and a gate bus 290 located on a transition region are formed to have connections with each other, in an example. However, a floating gate electrode 249 on a terminal region is not formed to have a linkage with a plurality of gate electrodes 242, 247 and gate bus 290 located on the transition region.

Figure 6E:
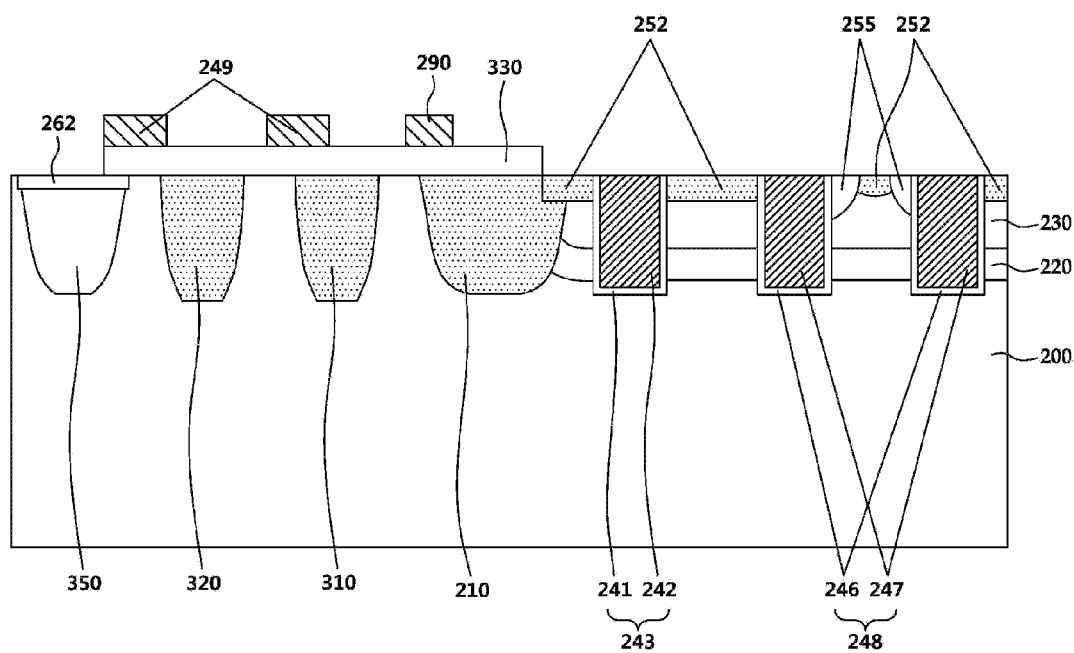
Figure 6F:
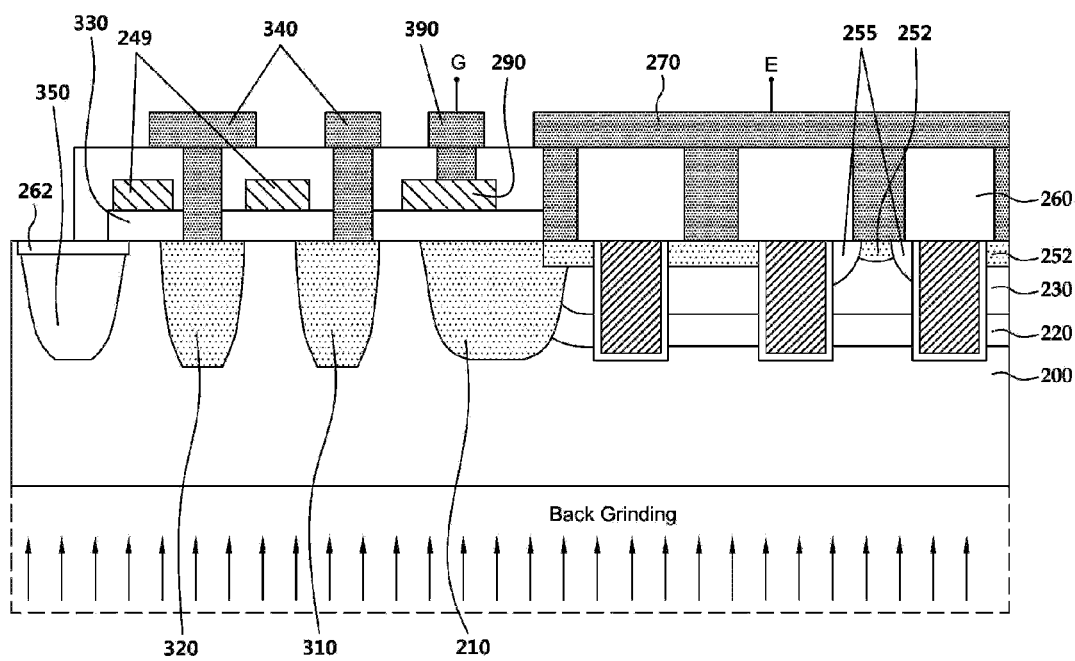

Further, as illustrated in the example of FIG. 6E, a P-type doping region 252 of high concentration of dopant and an N-type source region 255 are formed in part in a region between two trenches. For this, a fifth mask process, a P-type impurity such as B, BF, and so on, as discussed above, are added by injection and a third annealing heat treatment process for impurity distribution is applied. Here, a lower temperature and a shorter annealing time are required than temperature and time used in a first annealing heat treatment process. Thus, a second annealing heat treatment process is implemented as discussed before so as to have a lower depth. The P-type base region 230 is formed to have a smaller width and lower depth than N-type well region 220 from a substrate surface. A P-type base region 230 becomes a channel region between a N+ source region and a N– drift region of the semiconductor substrate 200.

Further, as illustrated in the example of FIG. 6E, a P-type doping region 252 of high doping concentration and a N-type source region 255 are formed on a region situated between two trenches. For this, which is a sixth mask process, an N-type impurity injection, such as Phosphorous and so on, and a seventh mask process, involving a P-type impurity injection, such as Boron and so on, in order, are implemented. In particular, a plurality of trench structures include a dummy trench and at least a pair of first trenches 248. The P-type doping region 252 of high concentration and N-type source region 255 are formed on a region between the pair of first trenches 248.

For example, a repetitive pattern of a dummy trench 243 and a pair of first trenches 248 is formed in a center direction of a cell region. Thus, a dummy trench 243 is located on the left or the right of a pair of first trenches 248. Likewise, a plurality of trench structures is differentiated into a dummy trench 243 and a first trench 248. A P-type doping region of high concentration 248 and a N-type source region 255 are disposed on an adjacent region between a pair of first trenches 248. Moreover, such a P-type doping region of high concentration 252 is formed on a P-type base region that is located between a dummy trench 243 and a pair of first trenches 248. However, an N-type source region 255 is not formed between the dummy trench 243 and the first trench. That is, there is a P-type doping region of high concentration 252 that is formed to be adjacent with the dummy trench and a first trench, but the N-type source region 255 is not adjacent with the dummy trench. Thus, a hole current flows out quickly into the P-type doping region 252 under a short-circuit condition. Thereby, short-circuit immunity of such an example is increased.

Thus, a P-type doping region of high concentration 252 is necessary not only for ohmic contact, but also has an effect of preventing latch-up phenomena of an IGBT device. In particular, holes from a collector layer 292 pass through a substrate or drift region and move up to an N-type source region 255. The N-type source region 255 is involuntarily turned-on and thereby latch-up phenomena are generated. As a high concentration P-type doping region 252 is formed on a region between a pair of first trenches 248, the latch-up phenomena are prevented. Moreover, in an example, a high concentration N-type doping region 262 of a termination edge region is formed along with source region 255.

Further as illustrated in the example of FIG. 6F, an inter-metal dielectric layer 260 is formed to cover top of gate electrodes 242, 247, 249, 290. Moreover, after patterning inter-metal dielectric layer 260, the emitter electrode 270, the gate terminal 390, and the field plate 240 are formed. For this, the inter-metal dielectric layer 260 is deposited using two layer including an oxidized layer and a borophosphosilicate glass (BPSG) layer. Moreover, the metal layers 270, 340 are deposited to electrically connect with a source region 255, a high concentration P-type doping region 252, a first, second and third termination rings 210, 310, 320 respectively. For example, a titanium/titanium nitride (Ti/TiN) barrier layer, or aluminum (Al) metal can be used as a metal layer. Moreover, tungsten/aluminum (W/Al), or copper (Cu) metal layer is potentially used instead of Ti/TiN/Al. Thus, the emitter electrode 270, the gate terminal 390, and field plate 340 comprised of metal layers are formed. An emitter electrode 270 is electrically connected with a source region 255, a high concentration P-type doping region 252, and a first termination ring 210. Moreover, a gate terminal 390 is electrically connected with a gate bus 290 through a contact plug. Further, a field plate 340 is electrically connected with second and third termination rings 310, 320.

Moreover, also a grinding or back-grinding process pertaining to the lower side or bottom side of a semiconductor substrate 200 is conducted. An N-type epi layer of high concentration that is not shown becomes a field stop layer 280. An N-type epi layer of low concentration that is not shown becomes a drift region layer. These layers are formed further inside of a semiconductor substrate 200. Thus, when a back grinding process is performed, a high concentration epi layer is exposed. Such a high concentration N-type epi layer is used as a field stop layer 280. If the epi layer does not have a high concentration and low concentration N-type epi layer, and hence, the epi layers have the same concentration, a field stop layer 280 is formed by implantation of N-type impurities with respect to a bottom side or back side of a semiconductor substrate 200. In this case, equipment with high energy of implantation is necessary to ensure successful implantation. However, as aforementioned, when a wafer with a high concentration/low concentration epi layer is used, such a field stop layer 280 does not need an high energy of implantation. Thus, a wafer back side is ground until a high concentration epi layer is exposed.

Figure 6G:
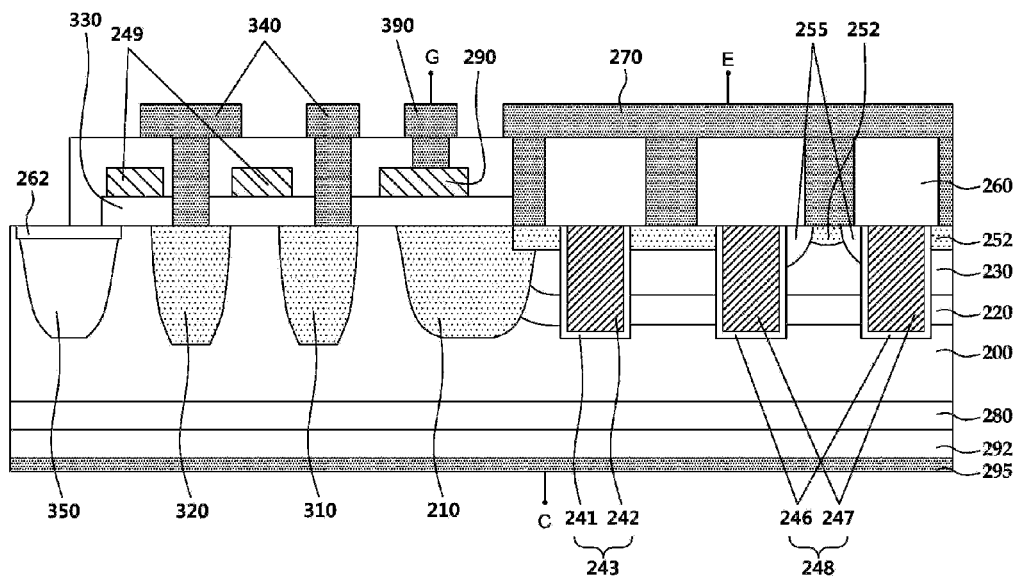

Further, as illustrated in the example of FIG. 6G, collector layer 292 is formed through ion injection of a P-type impurity. Thereby, the field stop layer 280 and the collector layer 292 are formed to overlapped in order on a bottom side of a semiconductor substrate 200. To form such a collector layer 292, a process of distributing the impurity through an annealing or baking process is applied after ion injection. Finally, by depositing metal material on a bottom section of the collector layer 292 through back metal deposition process, a drain electrode 295 is formed.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A power semiconductor device comprising:
    a substrate;
    a trench structure situated in the substrate and comprising first trenches and dummy trenches formed adjacent to the first trenches;
    a first well region of a second conductivity type situated between the first trenches;
    a base region of a first conductivity type situated on the first well region;
    a source region of the second conductivity type and a first contact region of the first conductivity type situated in the base region;
    gate insulating layers situated in the first trenches and the dummy trenches;
    gate electrodes situated on the gate insulating layers;
    a field stop layer situated below the base region;
    a collector layer and a drain electrode situated below the field stop layer; and
    a dummy cell region situated between the first trenches and the dummy trenches,
    wherein the dummy cell region has no channel region.

2. The power semiconductor device of claim 1, further comprising:
    a cell region, a transition region and a termination region located in the substrate;
    a first termination ring of the first conductivity type having a first depth surrounding the cell region, situated in the transition region; and
    a second termination ring adjacent to the first termination ring, situated in the termination region, and
    wherein the first termination ring has a width larger than that of the second termination ring.

3. The power semiconductor device of claim 2, further comprising:
    a second well region of the second conductivity type having a doping concentration higher than that of the semiconductor substrate and that is situated adjacent to the second termination ring.

4. The power semiconductor device of claim 1, wherein the first trenches and the dummy trenches have a trench depth deeper than that of the first well region.

5. The power semiconductor device of claim 1, further comprising:
    an emitter electrode connected to the first termination ring, the source region and the first contact region;
    a gate terminal electrically connected to the gate electrode; and
    a field plate situated over the substrate and connected to the second termination ring.

6. The power semiconductor device of claim 5,
    wherein a second contact region of the first conductivity type is situated in the first termination ring and is electrically connected to the emitter electrode.

7. The power semiconductor device of claim 1, wherein the substrate comprises a first surface and a second surface opposite to the first surface.

8. A manufacturing method of forming the power semiconductor device according to claim 1, the method comprising:
    forming the substrate to comprise a first epi layer of low doping concentration and a second epi layer of high doping concentration.

9. The manufacturing method of claim 8,
    wherein the substrate comprises a first surface and a second surface opposite to the first surface, and
    wherein forming the field stop layer on the back of the substrate is performed by conducting a back grinding process on a second surface of the semiconductor substrate and by exposing the second epi layer.

10. The manufacturing method of claim 8, wherein forming the gate electrode in the trench structure comprises
    depositing a polysilicon layer with a top surface in the trench structure;
    oxidizing a top surface of the polysilicon layer to form an oxidized surface layer of the polysilicon layer;
    removing the oxidized surface layer using wet-etching; and
    performing an etch-back process to form the gate electrode.

11. A power semiconductor device comprising:
    a substrate, comprising a cell region, a transition region and a termination region located in the substrate;
    first trenches and dummy trenches located adjacent to the first trenches, situated in the substrate, wherein the first trenches and the dummy trenches each comprise a gate insulating layer that comprises a gate electrode;
    a well region of a second conductivity type situated between the first trenches comprising a base region of a first conductivity type situated on the first well region, wherein the base region comprises a source region of the second conductivity type and a first contact region of the first conductivity type, situated in the base region;
    a field stop layer situated below the base region;
    a collector layer and a drain electrode situated below the field stop layer; and
    a dummy cell region situated between the first trenches and the dummy trenches,
    wherein the dummy cell region has no channel region.

12. The power semiconductor device of claim 11, further comprising:
    a first termination ring of the first conductivity type having a first depth surrounding the cell region, formed in the transition region; and
    a second termination ring adjacent to the first termination ring, formed in the termination region, and
    wherein the first termination ring has a width larger than that of the second termination ring.

13. The power semiconductor device of claim 11, wherein the substrate comprises a first surface and a second surface opposite to the first surface.

14. The power semiconductor device of claim 11, further comprising:

a second well region of the second conductivity type having a doping concentration higher than that of the semiconductor substrate and that is situated adjacent to the second termination ring.

15. The power semiconductor device of claim 11, wherein the first trenches and the dummy trenches have a trench depth deeper than that of the first well region.

16. The power semiconductor device of claim 11, further comprising:
    an emitter electrode connected to the first termination ring, the source region and the first contact region;
    a gate terminal electrically connected to the gate electrode; and
    a field plate situated over the substrate and connected to the second termination ring.

17. The power semiconductor device of claim 16, wherein a second contact region of the first conductivity type is situated in the first termination ring and is electrically connected to the emitter electrode.

18. A method of forming a power semiconductor device comprising:
    preparing a semiconductor substrate, wherein the substrate comprises a first epi layer of low doping concentration and a second epi layer of high doping concentration, wherein the substrate is divided into a termination region, a transition region, and a cell region;
    forming a first termination ring on the transition region or the termination region of the substrate;
    forming a first well region in the cell region that overlaps with the first termination ring;
    forming trench structures to have a certain depth in the substrate, comprising first trenches and dummy trenches;
    forming gate insulating layers and gate electrodes in the trench structures;
    forming a base region of a first conductivity type situated on the first well region;
    forming a source region of the second conductivity type and a first contact region of the first conductivity type situated in the base region;
    forming a field stop layer situated below the base region;
    forming a collector layer and a drain electrode situated below the field stop layer; and
    forming a dummy cell region situated between the first trenches and the dummy trenches,
    wherein the dummy cell region has no channel region.

19. The method of claim 18, wherein the first termination ring is formed by ion injecting an impurity, performing a first mask process, and performing a first annealing.

20. The method of claim 19, wherein the first well region is formed using a second mask process and a second annealing.

21. The method of claim 18, wherein forming the trench structures comprises using a hard mask layer comprising 3 layers of insulating film.

22. The method of claim 18, wherein the first trenches and the dummy trenches have a trench depth deeper than that of the first well region.

23. The method of claim 18, further comprising forming a second termination ring, wherein the first termination ring has a greater width than the second termination ring.

24. The method of claim 18, further comprising depositing a polysilicon layer with a top surface in the trench structure;
    oxidizing a top surface of the polysilicon layer to form an oxidized surface layer of the polysilicon layer;
    removing the oxidized surface layer using wet-etching; and
    performing an etch-back process to form the gate electrodes.

* * * * *